(12) United States Patent
Garby et al.

(10) Patent No.: US 7,388,542 B2
(45) Date of Patent: Jun. 17, 2008

(54) METHOD FOR AN ELEMENT USING TWO RESIST LAYERS

(75) Inventors: Sandra M. Garby, Bangor, PA (US); Robert R. Oberle, Macungie, PA (US)

(73) Assignee: RCD Technology, Inc., Quakertown, PA (US)

( * ) Notice: Subject to any disclaimer, the term of this patent is extended or adjusted under 35 U.S.C. 154(b) by 127 days.

(21) Appl. No.: 11/271,361

(22) Filed: Nov. 10, 2005

(65) Prior Publication Data

US 2007/0103379 A1   May 10, 2007

(51) Int. Cl.
*H01Q 1/38* (2006.01)
(52) U.S. Cl. .............. 343/700 MS; 343/895; 29/600
(58) Field of Classification Search .......... 343/700 MS, 343/895; 257/679; 438/689; 29/600
See application file for complete search history.

(56) References Cited

U.S. PATENT DOCUMENTS

| | | | |
|---|---|---|---|
| 3,759,246 A | 9/1973 | Flack et al. | |
| 5,058,161 A | 10/1991 | Weiss | |
| 5,463,377 A | 10/1995 | Kronberg | |
| 5,598,032 A | 1/1997 | Fidalgo | |
| 5,629,981 A | 5/1997 | Nerlikar | |
| 5,874,902 A | 2/1999 | Heinrich et al. | |
| 5,892,611 A | 4/1999 | Iisuka | |
| 5,942,978 A | 8/1999 | Shafer | |
| 5,963,134 A | 10/1999 | Bowers et al. | |
| 6,049,461 A | 4/2000 | Haghiri-Tehrani et al. | |
| 6,089,284 A | 7/2000 | Kaehler et al. | |
| 6,111,520 A | 8/2000 | Allen et al. | |
| 6,130,623 A | 10/2000 | MacLellan et al. | |
| 6,133,833 A | 10/2000 | Sidlauskas et al. | |
| 6,204,760 B1 | 3/2001 | Brunius | |
| 6,400,323 B2 | 6/2002 | Yasukawa et al. | |
| 6,421,013 B1 | 7/2002 | Chung | |
| 6,514,790 B1 | 2/2003 | Plettner et al. | |
| 6,582,887 B2 | 6/2003 | Luch | |
| 6,774,800 B2 | 8/2004 | Friedman et al. | |
| 6,780,001 B2 * | 8/2004 | Eldridge et al. | 425/385 |
| 6,849,936 B1 | 2/2005 | Berman et al. | |
| 6,930,044 B1 * | 8/2005 | Weng | 438/671 |
| 2002/0140608 A1 | 10/2002 | Zaghloul et al. | |
| 2003/0104649 A1 | 6/2003 | Ozgur et al. | |
| 2003/0116790 A1 | 6/2003 | Kikuchi et al. | |
| 2004/0070510 A1 | 4/2004 | Zhang et al. | |
| 2004/0159257 A1 | 8/2004 | Mathieu | |
| 2004/0203235 A1 * | 10/2004 | Miyakawa | 438/689 |
| 2005/0078035 A1 | 4/2005 | Oberle | |

FOREIGN PATENT DOCUMENTS

EP   0 903 805 A2   3/1999

OTHER PUBLICATIONS

International Search Report for PCT/US06/60604 dated Oct. 2, 2007: 7 pages.

* cited by examiner

*Primary Examiner*—Hoang V. Nguyen
(74) *Attorney, Agent, or Firm*—Fliesler Meyer LLP

(57) ABSTRACT

A two resist layer process allows a seed layer to be used to electroplate a conductive layer of an element in a way that a portion of the seed layer can be removed.

19 Claims, 3 Drawing Sheets

METHOD FOR AN ELEMENT USING TWO RESIST LAYERS

BACKGROUND OF THE INVENTION

The present invention relates to methods of manufacture of flexible circuits such as those used in construction of radio frequency (RF) antenna.

Radio frequency antenna are typically made in a conductive coil pattern. The conductive coil pattern allows the antenna to receive and radiate energies in the radio frequency range. Typically, the antenna is optimized to transmit and receive energy in a relatively narrow portion of the radio frequency range.

Radio frequency antenna are used in a number of different areas including inventory control. Often the radio frequency antenna is connected to an integrated circuit. The integrated circuit receives energy from a detector unit, modulates the energy with an identification pattern stored in the integrated circuit, and then retransmits the modulated energy to the detector unit. Such inventory control units, including the radio frequency antenna, can be made quite inexpensively.

DETAILED DESCRIPTION OF THE PREFERRED EMBODIMENTS

Figure 1A:
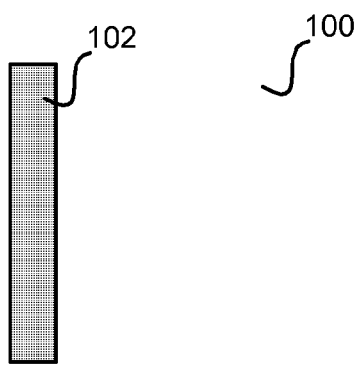
FIG. 1A-1E are diagrams of a method of producing an element, such as an RFID antenna.

FIG. 1A-1E show a method of forming an element, such as an RFID antenna. In FIG. 1A, a first resist layer 102 is put on a substrate 101. In one embodiment, the substrate 101 is a flexible substrate which allows the constructed radio frequency antenna or other element to bend. One example of a flexible substrate material which is suitable for use with the present invention is Mylar.RTM., polyester film from E.I. DuPont de Nemours, Wilmington, Del. The resist layers can be any type of non-conductive layer that can be formed on the substrate 101. In one embodiment, the resist is a liquid, such as the HEF-076HT resist available from the Englehard Corporation of Iselin, N.J.

Figure 1B:
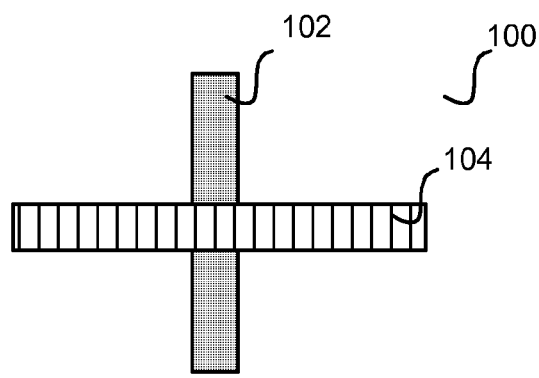

In FIG. 1B, a seed layer 104 is placed over the first resist layer 102. The seed layer can be formed with a conductive ink. In one embodiment, the conductive ink is Spraylat XCMS-012. The conductive ink layer can be cured.

Figure 1C:
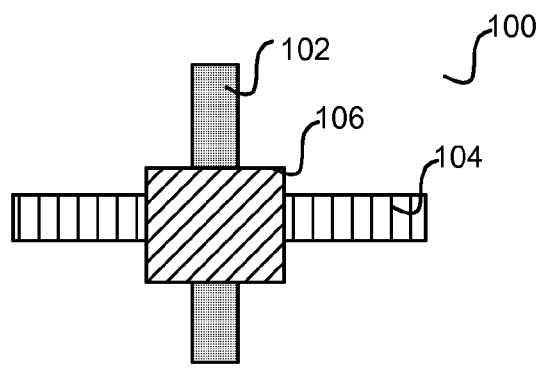

In FIG. 1C, a second resist layer 106 is formed over a portion of the seed layer 104. The second resist layer 106 can be made of the same material as the first resist layer 102.

Figure 1D:
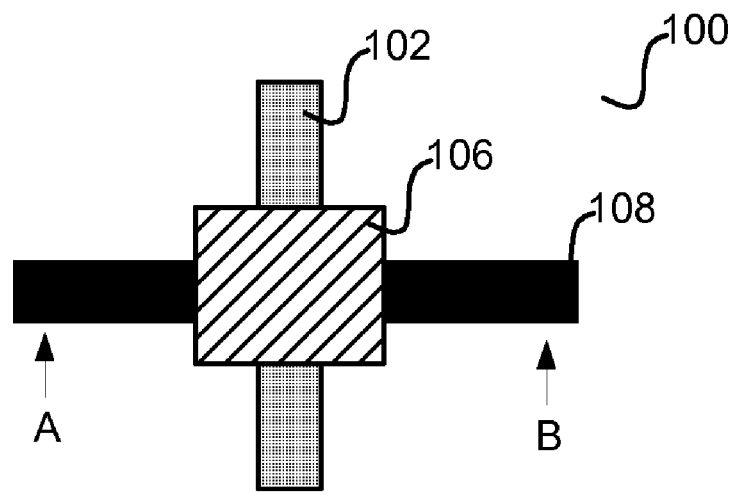

In FIG. 1D, the exposed portion of the seed layer 104 is electroplated to form a conductive layer 108. The conductive layer is not formed on those portions of the seed layer 104 that is covered by the second resist layer 106. The seed layer 104 can keep point A and point B electrically connected such that a probe at point A can be used to electroplate point B and vice versa.

Figure 1E:
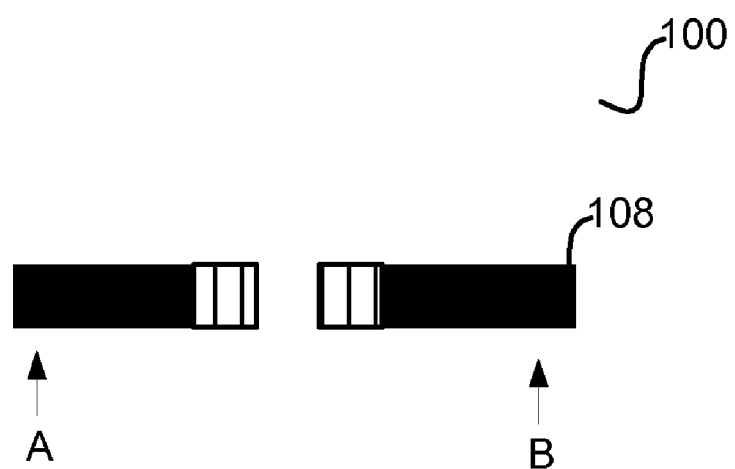

FIG. 1E shows the situation after the first and second resist layers are removed. The first and second resist layer can be removed with a stripping process. The portion of the seed layer that covers the first resist layer will also removed so that points A and B are now electrically isolated.

In one embodiment, resist layers and the insulating layer, are differentially removable (for example soluble in a solvent to which the initial seed layer is impervious) from the conductive ink material. The portion of the seed layer over the first resist layer will be undercut and thus removed along with the resist layers.

The conductive layer can be an inexpensive metal material. In one embodiment of the present invention, the conductive layer is made of copper. The stripping can be done using a solvent, ashing, reactive gas or any other method.

Point A can be part of a bus bar used for the construction of the element and point B can be part of the element, such as the RFID antenna.

Figure 2:
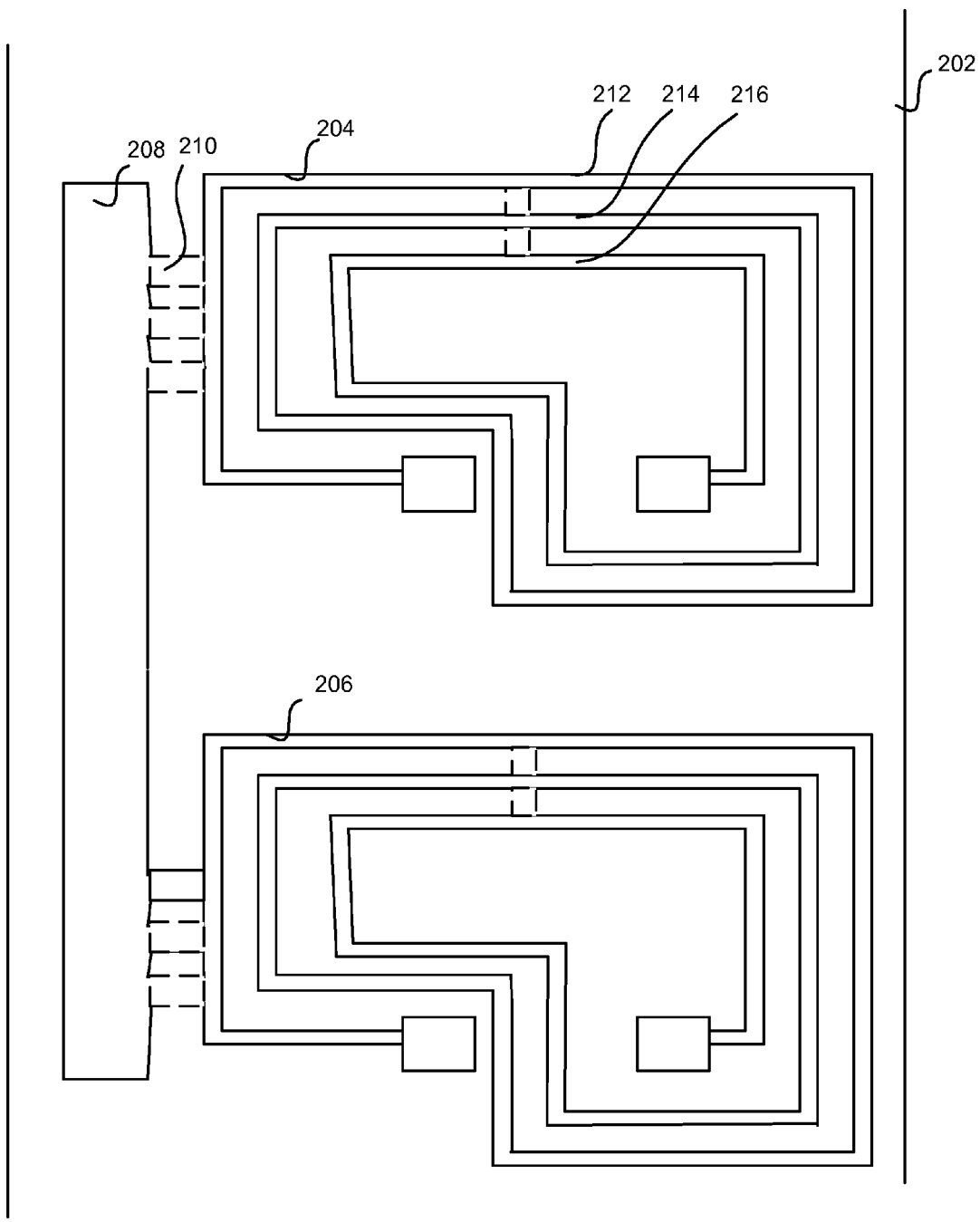
FIG. 2 is a diagram illustrating the construction of a radio frequency antenna of the present invention using a two resist layer method.

FIG. 2 shows an example of a substrate 202 with two antennas 204 and 206 formed upon it. The antennas shown in FIG. 2 are coil antennas. The antennas can also be dipole antennas, folded dipole antennas or another design. The temporary connection regions are shown with dotted lines.

The bus bar 208 can be used to electroplate over a seed layer. The method of the present invention can be used to temporarily connect the bus bar 208 with the antennas 204 and 206 in regions such as region 210. After the resist layer is stripped away, the electrical connection with the bus bar 208 is removed so that antennas 204 and 206 can be tested without interference.

Similarly, the method can be used to connect points, such as points 212, 214 and 216, that can allow the electroplating of the antennas, such as antenna 204, to be done evenly with the electrical connection completely removed when the two resist layers are stripped away.

Typically it is desired to minimize the resistance of the radio frequency antenna. A desirable property of radio frequency antenna is to have a relatively high Q factor. The Q factor for an antenna is defined as the imaginary over the real part of the impedance. The imaginary part of the impedance is typically a function of the desired operating frequency and geometry and is typically fixed. Thus, to produce a high Q factor antenna, the resistance of the antenna should be kept as small as possible. This means that it is desired to have a relatively thick conductive metal layer forming the coils of the radio frequency antenna. The use of the electrical-short layer aids in the construction of a uniformly thick electroplate layer, thus lowering the resistance and raising the Q factor.

The temporary connection can ensure that points on the conductive ink pattern will have relatively similar voltages during the electroplating process. This means all locations on the conductive ink pattern will be electroplated evenly. Thus the apparatus of one embodiment allows for a conductive electroplate layer of sufficient thickness on all points of the radio frequency antenna.

The use of the resist can allow for the use of a thinner and/or narrower conductive ink layer. The resistance of the conductive ink layer during the electroplate process is not as important of a factor because the electrical-short layer is used.

The above description is meant to be exemplary only. Additional ways of implementing the invention are done within the scope of the present invention, which is to be limited only by the appended claims.

What is claimed is:

1. A method of forming an element, comprising:
   forming a first resist layer on top of a substrate;
   forming a seed layer on top of at least a portion of the first resist layer;
   forming a second resist layer over a portion of the seed layer, a portion of the second resist layer being positioned above a portion of the first resist layer as well as above the portion of the second layer and;
   electroplating a conductive layer over exposed portions of the seed layer; and removing the first and second resist;
wherein after the removing, step the conductive layer includes at least two electrically isolated regions.

2. The method of claim 1, wherein the element is an antenna.

3. The method of claim 1, wherein the seed layer has a coil pattern.

4. The method of claim 1, wherein the electrically isolated regions are individual antenna elements.

5. The method of claim 1, wherein the seed layer comprises a conductive ink layer.

6. The method of claim 1, wherein the removing step comprises using a solvent to remove the first and second resist layers.

7. A method of forming an element, comprising:
forming a first resist layer on top of a substrate;
forming a seed layer on top of at least a portion of the first resist layer;
forming a second resist layer over a portion of the seed layer, a portion of the second resist layer being positioned above a portion of the first resist layer as well as above the portion of the second layer and;
electroplating a conductive layer over exposed portions of the seed layer; and
removing the first and second resist;
wherein the portion of the seed layer on top of the first resist layer electrically connects a bus bar to an antenna during the electroplating step.

8. A method of forming an element, comprising:
forming a first resist layer on top of a substrate;
forming a seed layer on top of at least a portion of the first resist layer;
forming a second resist layer over a portion of the seed layer, a portion of the second resist layer being positioned above a portion of the first resist layer as well as above the portion of the seed layer and;
electroplating a conductive layer over exposed portions of the seed layer; and
removing the first and second resist;
wherein the portion of seed layer on top of the first resist layer shorts together portions of an antenna coil during the electroplating step.

9. A method of forming an element, comprising:
forming a first resist layer on top of a substrate;
forming a seed layer on top of at least a portion of the first resist layer;
forming a second resist layer over a portion of the seed layer, a portion of the second resist layer being positioned above a portion of the first resist layer as well as above the portion of the seed layer and;
electroplating a conductive layer over exposed portions of the seed layer; and
removing the first and second resist;
wherein the portion of the seed layer on top of the first resist layer shorts together portions of a dipole antenna.

10. An element constructed by the process of:
forming a first resist layer on top of a substrate;
forming a seed layer on top of at least a portion of the first resist layer;
forming a second resist layer over a portion of the seed layer, a portion of the second resist layer being positioned above a portion of the first resist layer as well as above the portion of the seed layer and;
electroplating a conductive layer over exposed portions of the seed layer; and
removing the first and second resist;
wherein after the removing step the conductive layer includes at least two electrically isolated regions.

11. The element of claim 10, wherein the element is an antenna.

12. The element of claim 10, wherein the seed layer has a coil pattern.

13. The element of claim 10, wherein the seed layer comprises a conductive ink layer.

14. The element of claim 10, wherein the removing step comprises using a solvent to remove the first and second resist layers.

15. The element of claim 10, wherein the element has an exposed seed layer portion.

16. An element constructed by the process of:
forming a first resist layer on top of a substrate;
forming a seed layer on top of at least a portion of the first resist layer;
forming a second resist layer over a portion of the seed layer, a portion of the second resist layer being positioned above a portion of the first resist layer as well as above the portion of the seed layer and;
electroplating a conductive layer over exposed portions of the seed layer; and
removing the first and second resist;
wherein the portion of the seed layer on top of the first resist layer electrically connects a bus bar to an antenna during the electroplating step.

17. An element constructed by the process of:
forming a first resist layer on top of a substrate;
forming a seed layer on top of at least a portion of the first resist layer;
forming a second resist layer over a portion of the seed layer, a portion of the second resist layer being positioned above a portion of the first resist layer as well as above the portion of the seed layer and;
electroplating a conductive layer over exposed portions of the seed layer; and
removing the first and second resist;
wherein the portion of seed layer on top of the first resist layer shorts together portion of an antenna coil during the electroplating step.

18. An RFID antenna constructed by the process of:
forming a first resist layer on top of a substrate;
forming a seed layer on top of at least a portion of the first resist layer;
forming a second resist layer over a portion of the seed layer, a portion of the second resist layer being positioned above a portion of the first resist layer as well as above the portion of the seed layer and;
electroplating a conductive layer over exposed portions of the seed layer; and
removing the first and second resist;
wherein after the removing step the conductive layer includes at least two electrically isolated regions.

19. The RFID antenna of claim 18, wherein the antenna has an exposed seed layer portion.

* * * * *

UNITED STATES PATENT AND TRADEMARK OFFICE
CERTIFICATE OF CORRECTION

| | |
|---|---|
| PATENT NO. | : 7,388,542 B2 |
| APPLICATION NO. | : 11/271361 |
| DATED | : June 17, 2008 |
| INVENTOR(S) | : Sandra M. Garby et al. |

It is certified that error appears in the above-identified patent and that said Letters Patent is hereby corrected as shown below:

In column 3, line 22, claim 17 delete "second" and insert --seed--.

Signed and Sealed this

Twelfth Day of August, 2008

JON W. DUDAS
*Director of the United States Patent and Trademark Office*